(12) United States Patent
Chan et al.

(10) Patent No.: US 9,517,927 B2
(45) Date of Patent: Dec. 13, 2016

(54) MEMS STRUCTURE HAVING ROUNDED EDGE STOPPER AND METHOD OF FABRICATING THE SAME

(71) Applicant: TAIWAN SEMICONDUCTOR MANUFACTURING CO., LTD., Hsinchu (TW)

(72) Inventors: Chih-Jen Chan, Changhua (TW); Chang-Ming Wu, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/700,138

(22) Filed: Apr. 29, 2015

(65) Prior Publication Data

US 2016/0318754 A1    Nov. 3, 2016

(51) Int. Cl.
*B81B 3/00*      (2006.01)
*B81C 1/00*      (2006.01)

(52) U.S. Cl.
CPC ......... *B81B 3/0005* (2013.01); *B81C 1/00992* (2013.01); *B81C 2201/112* (2013.01)

(58) Field of Classification Search
CPC .................. B81B 3/0005; B81C 1/00992
See application file for complete search history.

(56) References Cited

U.S. PATENT DOCUMENTS

| | | | |
|---|---|---|---|
| 2011/0127650 A1* | 6/2011 | Witvrouw | B81C 1/00333 257/622 |
| 2015/0060956 A1* | 3/2015 | Chen | B81C 1/00246 257/254 |

* cited by examiner

*Primary Examiner* — Long Pham
(74) *Attorney, Agent, or Firm* — Maschoff Brennan

(57) ABSTRACT

A method of fabricating MEMS device includes forming a plurality of rounded edge trenches on a sacrificial layer over a carrier substrate. Then, formation of a polycrystalline silicon layer over the sacrificial layer to fill the trenches. A plurality of stoppers is defined by the trenches and protrudes from the polycrystalline silicon layer toward the carrier substrate Subsequently, a portion of the sacrificial layer is removed to define a recess between the polycrystalline silicon layer and a carrier substrate and expose the stoppers.

18 Claims, 8 Drawing Sheets

MEMS STRUCTURE HAVING ROUNDED EDGE STOPPER AND METHOD OF FABRICATING THE SAME

BACKGROUND

Functional density of integrated circuit (IC) has never ceased to increase so as to accommodate even more components per chip area. The size of the components has to decrease along the course of the evolution. The scaling down is accompanied by inevitable complexity in design and fabrication.

With the advent of wafer level packaging of a micro electrical mechanical system (MEMS) device, these advances can be realized. MEMS devices provide a new perspective of what integrated circuits can achieve including power generation, light projection, force sensing, switching and combination of novel materials and process. Since MEMS devices incorporate multiple substrates, the scaffolding of the MEMS devices is relatively articulate. In the presence of movable members, protection mechanisms are employed to attenuate the impact caused by collision. While existing techniques for stiction prevention have been adequate, they have not been entirely satisfactory in all regards.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
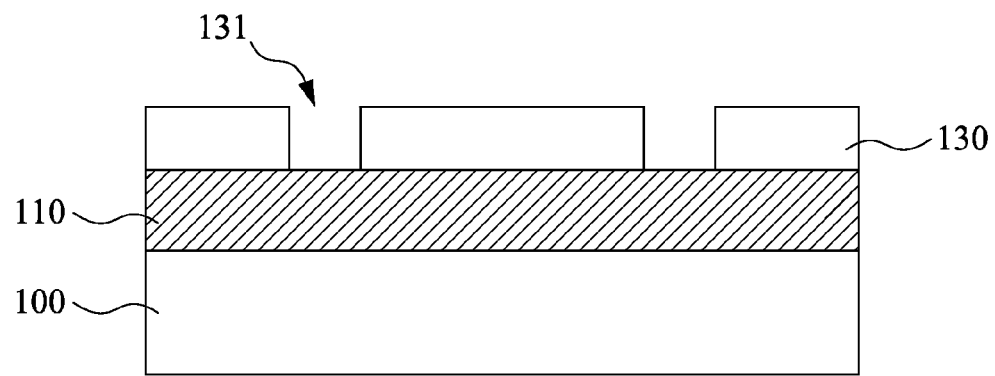
FIGS. 1A-1F are cross-sectional side view of a MEMS component undergoing a method of formation in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Micro electronic mechanical system (MEMS) structure is typical of a component found in micro-accelerometer, micro-gyroscopes, pressure sensors, switches, resonators and other application. The structure contains movable members that shift within a predetermined space. As the movable members drift from their resting place, collision between the neighbouring components is inevitable. Stoppers are then developed to attenuate the force created in the crash. Typically, an oxide layer is disposed on a silicon substrate, and a patterned photoresist (PR) layer is used as an etch mask to define stopper on the silicon substrate. The profile of the stopper is determined by the step of dry etching the oxide layer, resulting in sharp corners at its edge. Although the stopper reduces the impact of the crashing force on the movable member, at the same time, the sharp corners of the stopper are worn away by the force. Residues of the stopper scatter and accumulate in the region where particle contamination takes place. In a worse case, the residue particles hinder the motion of the movable members or even cause deformation to the MEMS device or device failure. For example, a puncture on the substrate may be formed or the particles block normal motion of the movable member. The undesirable result is not only a decline in smooth motion but also a loss in the function of attenuation. The complex MEMS device structure is therefore prone to malfunction, and the reliability of the entire integrated circuits is greatly reduced.

FIGS. 1A-1F are cross-sectional side view of a MEMS structure 10 undergoing a method of formation in accordance with some embodiments of the instant disclosure. FIGS. 1A-1F have been simplified for the sake of clarity. The MEMS structure 10 has at least a movable member and is merely one example of a class of MEMS components where two or more substrates are joined. While the instant disclosure deals generally in the context of a suspended beam structure, the principles disclosed herein apply equally to other MEMS structures incorporating joined substrates. Applications of these principles will be recognized by one of skill in the art, and such applications and structures are both contemplated and provided for.

Figure 3:
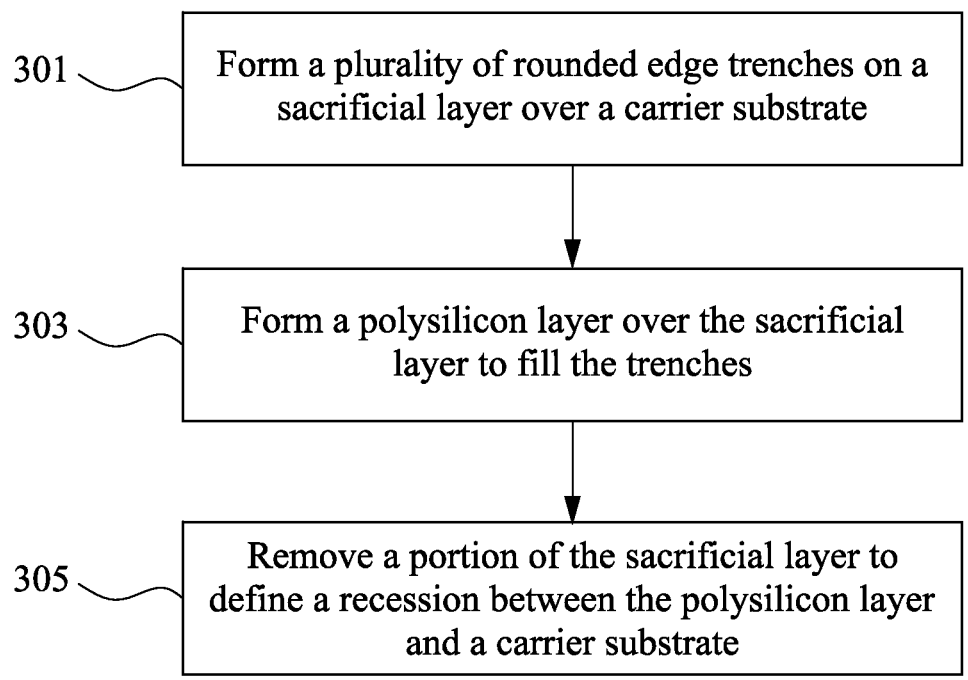
FIG. 3 is a flow diagram of a method of forming a MEMS component in accordance with some embodiments of the instant disclosure.

A method of fabrication a MEMS structure is disclosed with reference to FIGS. 1A-1F in conjunction with FIG. 3. FIG. 3 is a flow diagram of a method 300 of forming a MEMS structure according to aspects of the instant disclosure. It is understood that additional steps can be provided before, during, and after the method 300, and some of the steps described can be replaced or eliminated for other embodiments of the method.

Referring to block 301 and FIG. 1A, a carrier substrate 100 is received. The carrier substrate 100 is used to aid the processing of other wafers and may be selected based on mechanical rigidity, thermal compatibility, surface qualities, composition, and/or other qualities. The carrier substrate 100 may include an elementary semiconductor such as silicon or germanium and/or a compound semiconductor, such as silicon germanium, silicon carbide, gallium arsenic, indium arsenide, gallium nitride, and indium phosphide. Other exemplary materials include alloy semiconductors, such as silicon germanium carbide, gallium arsenic phosphide, and gallium indium phosphide. The carrier substrate 100 may have one or more layers defined within it. The carrier substrate 100 may include non-semiconductor materials including soda-lime glass, fused silica, fused quartz, calcium fluoride ($CaF_2$) and/or other suitable material.

While the carrier substrate 100 is typically understood as a support to be used during processing, in some embodiments, the carrier substrate 100 includes one or more active devices formed thereupon. Therefore, the carrier substrate 100 may include doped regions, gate structures, isolation structures, interconnect layers, and other active device elements known to those skill in the art.

Still referring to FIG. 1A, in the illustrated embodiment the carrier substrate 100 includes a sacrificial layer 110. The sacrificial layer 110 is a dielectric layer that may include an oxide material, such as silicon oxide, a nitrogen-containing material, such as silicon nitride or silicon oxynitride, an amorphous carbon material, silicon carbide, tetraethylorthosilicate (TEOS), other suitable materials, and/or combinations thereof. Common methods for depositing the sacrificial layer 110 include spin-on deposition, physical vapor deposition (PVD), chemical vapor deposition (CVD), high-density plasma CVD (HDP-CVD), atomic layer deposition (ALD), and/or other suitable deposition process.

Figure 1B:
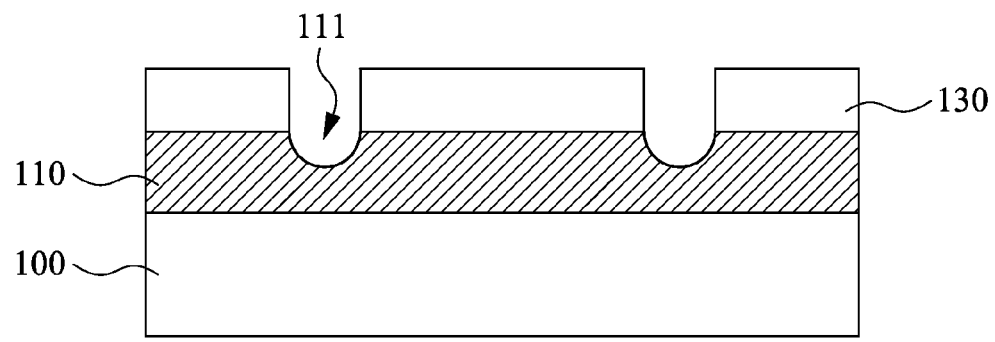

In block 301, a plurality of rounded edge trenches is formed on the sacrificial layer 110. The rounded edge trenches are achieved by anisotropic etching. Etching may include a photolithographic patterning process, where a photoresist coating is applied to the sacrificial layer 110, exposed, and developed to uncover portion of the sacrificial layer 110 to be etched. As shown in FIG. 1A, a mask layer 130 is used in the photolithographic process. The process may include spin-on coating the mask layer 130, soft baking, mask aligning, exposure, post-exposure baking, developing the photoresist, rinsing and drying. After the mask layer 130 is formed and shaped to expose a portion of the sacrificial layer 110 through a pattern 131, the sacrificial layer 110 is etched as shown in FIG. 1B. Suitable etching processes include wet etching, hydrofluorine (HF) etching and/or anisotropic dry etching.

Still referring to FIG. 1B, after the sacrificial layer 110 undergoes the etching process, a plurality of rounded edge trenches 111 is formed. The etching process may include cycles of different types of etching. For example, a wet etching may be used to form a general contour of the trenches 111, and then an anisotropic dry etching is used to fine tune the curvature of the trenches 111. The trenches 111 have rounded edges, or more specifically, resembling a hemisphere. Sharp corners are made blunt to smooth curvature by the cycles of etching process, and selective etchability contributes to the fine tune result. The trenches 111 resemble hemisphere recessing toward the carrier substrate 100, using the sacrificial layer 110 as its normal plane. A depth of the trenches 111 is shorter than the thickness of the sacrificial layer 110. That is, the trenches 111 do not go through the sacrificial layer 110 and will not expose underlying substrates. In the illustrated embodiment, the trenches 111 do not expose the carrier substrate 100. However, it should be understood that other geometrical configuration is also acceptable as long as the trenches 111 have a curved contour. Thus, the trenches 111 may be tuned to, for example, a balloon-like shape. The etched areas over the sacrificial layer 110 (i.e., the trenches 111) define stoppers that will subsequently attenuate collision when a movable member shifts.

Figure 1C:
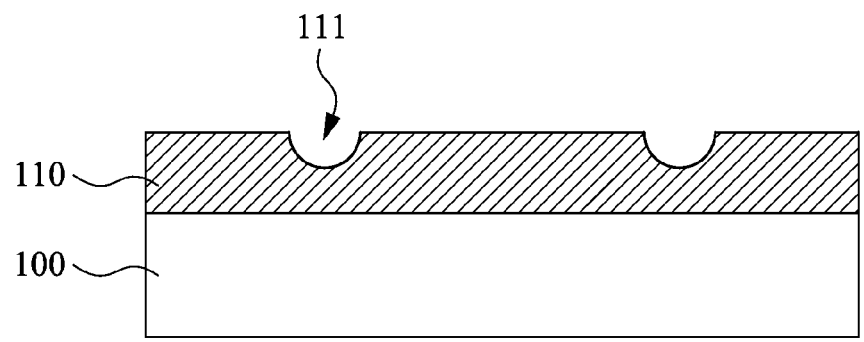
Figure 1D:
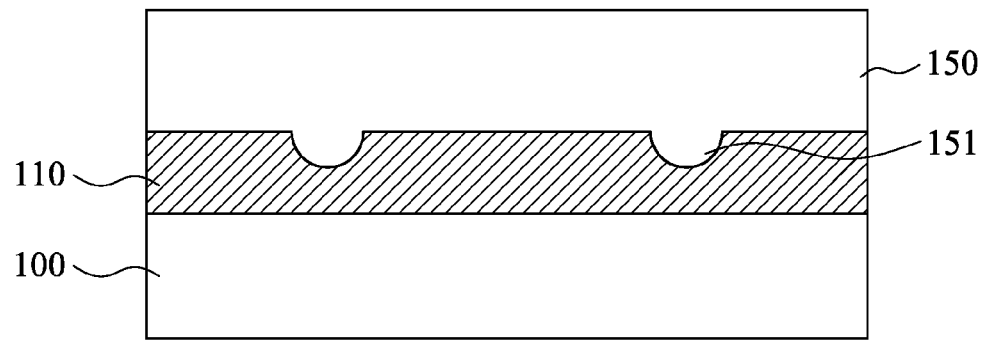

Referring to FIG. 1C, the mask layer 130 is removed and the rounded edge trenches 111 formed on the sacrificial layer 110 are exposed. Referring to block 303 and FIG. 1D, a polycrystalline silicon (polycrystalline silicon) layer 150 is formed on the sacrificial layer 110. Portions of the polycrystalline silicon layer 150, such as the portions formed in the trenches 111, define stoppers 151. As the polycrystalline silicon layer 150 may be used in a subsequent fusion bond process, the materials used in the polycrystalline silicon layer 150 may be selected based on bonding properties as well as mechanical integrity, such as epitaxially-grown polycrystalline silicon (epi-poly). The polycrystalline silicon layer 150 may be formed by any suitable process and to any thickness given it exceeds the depth of the trenches 111. Typical process for forming the polycrystalline silicon layer 150 include vapor-phase epitaxy (VPE) using a feed gas such as silicon tetrachloride and a CVD process using a feed gas such as silane. Other suitable techniques include spin-on application, PVD, other CVD processes, HDP-CVD, and/or ALD. A chemical-mechanical polishing/planarization (CMP) process may also be used to provide a suitable surface for the subsequent deposition or bonding. As illustrated in FIG. 1D, the polycrystalline silicon layer 150 is deeper in regions corresponding to stoppers 151. That is, the polycrystalline silicon layer 150 fills the etched areas (i.e., the trenches 111) of the sacrificial layer 110 and does not make contact with the underlying substrate, such as the carrier substrate 100.

Figure 1E:
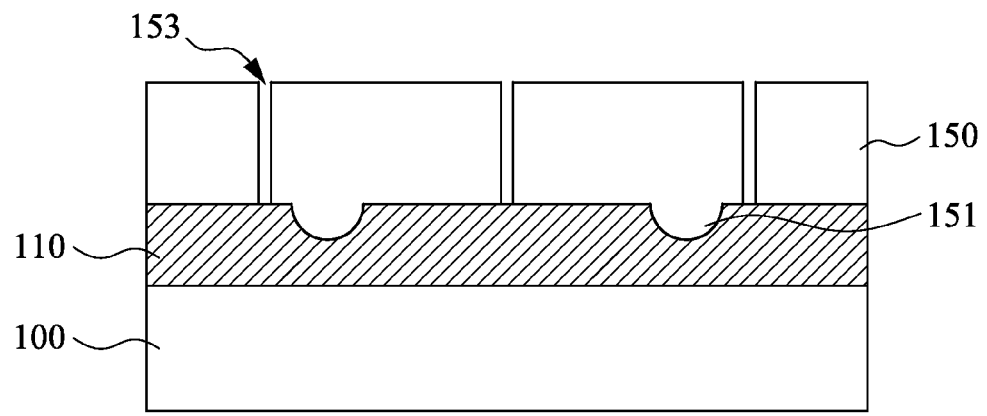

Referring to FIG. 1E, etching is performed on the polycrystalline silicon layer 150. Etching may include a photolithographic patterning process, which, in turn, may include applying a photoresist coating as previously discussed. Alternatively, the photolithographic process may be implemented, supplemented, ore replaced by other methods such as maskless photolithography, electron-beam writing, and ion-beam writing. Suitable etching processes include dry etching, wet etching and/or other etching methods (e.g., reactive ion etching). In the illustrated embodiment, the etching process forms vias 153. The vias 153 go through the entire depth of the polycrystalline silicon layer 150 without traversing the stoppers 151. The stoppers 151 remain intact after performing etching on the polycrystalline silicon layer 150.

Figure 1F:
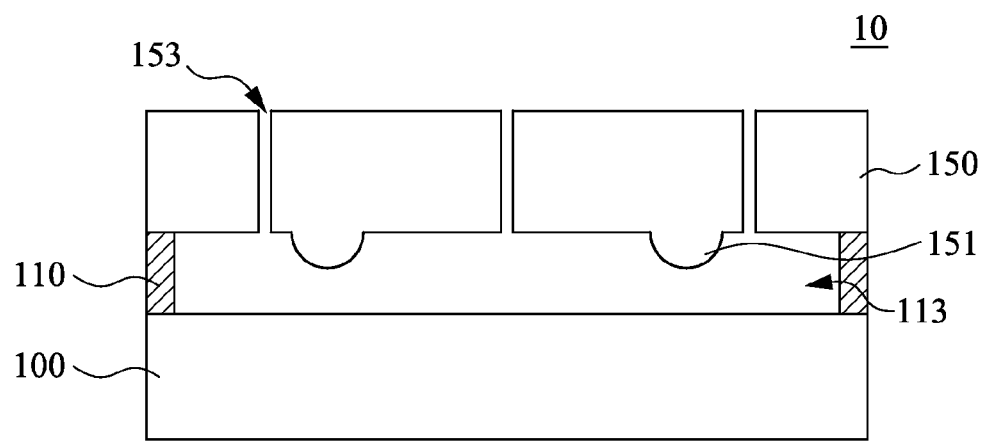

Referring to FIG. 1F in conjunction with block 305, a portion of the sacrificial layer 110 is released from the carrier substrate 100. The releasing of the sacrificial layer 110 is achieved by selective etching through the vias 153. As illustrated in FIG. 1F, the selective etching leaves certain structures untouched, such as stoppers 151. As can be seen releasing the sacrificial layer 110 does not necessarily disconnect the polycrystalline silicon layer 150 from the carrier substrate 100. The polycrystalline silicon layer 150 remains connected through the remaining portion of the sacrificial layer 110. The remaining sacrificial layer 110 may serve as anchor of the polycrystalline silicon layer 150 to the carrier substrate 100. The polycrystalline silicon layer 150 is largely suspended over the carrier substrate 100 at this stage. A recess 113 is formed after the releasing of the sacrificial layer 110. The recess 113 is collectively defined by the polycrystalline silicon layer 150, the carrier substrate 100 and the remaining portion of the sacrificial layer 110. The polycrystalline silicon layer 150 and the carrier substrate 100 are arranged substantially parallel and define the lengthwise contour of the recess 113. The sacrificial layer 110 encloses the recess 113 from either side to create a space within. After the removal of the sacrificial layer 110, the stoppers 151 are entirely exposed in the recess 113, and the stoppers 151 suspend over the carrier substrate 100 without making contact. In other words, the stoppers 151 hang over the recess 113 with a gap between the carrier substrate 100. In the process of fabricating the MEMS device 10, the sacrificial layer 110 allows the stopper 151 to exceed the original depth of the polycrystalline silicon layer 150. Meanwhile, after the sacrificial layer 110 is released, the short gap between the stopper 151 and the carrier substrate 100 provides a further buffering space under an event of crashing.

The stoppers 151 inherit the smooth contour defined by the trenches 111 and serve as shock absorber of the movable members in the MEMS devices in a specific direction. More specifically, in a three dimensional space, a movable member may acquire protection from either sides, for example, the outer edge region of the polycrystalline silicon layer 150 flushed against the sacrificial layer 110 and the carrier substrate 100. However, the protection area is strictly limited to the thickness of the polycrystalline silicon layer 150, and the protection structure can hardly extend further outwardly. When the shock attacks from another direction, for example, from the above, the stoppers 151 absorb the force with its extended thickness defined by the trenches 111 of the sacrificial layer 110. In other words, the stopper 151 is an integral bump of the polycrystalline silicon layer 150 but at the same time extending to the recess 113 for shock absorbing without using the main body.

FIGS. 2A-2L are cross-sectional side view of a MEMS structure 20 undergoing a method of formation in accordance with some embodiments of the instant disclosure. FIGS. 2A-2L have been simplified for the sake of clarity. The MEMS structure 20 is merely one example of a class of MEMS components where two or more substrates are joined.

Figure 2A:
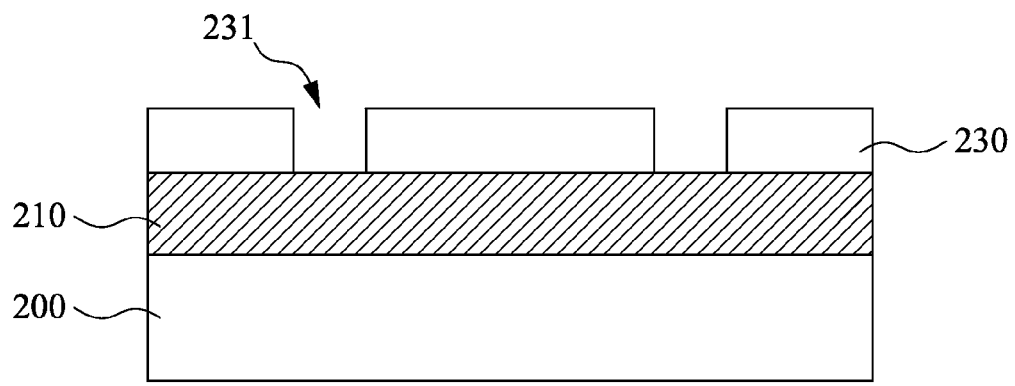
FIGS. 2A-2L are cross-sectional side view of a MEMS component undergoing a method of formation in accordance with some embodiments of the instant disclosure.
Figure 2B:
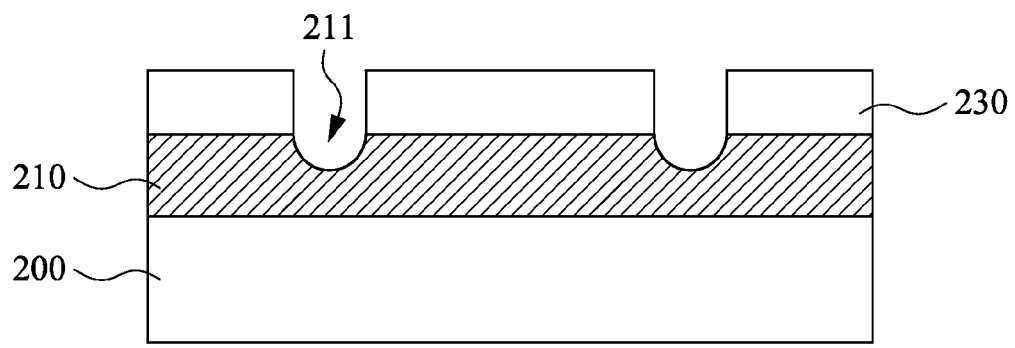
Figure 2C:
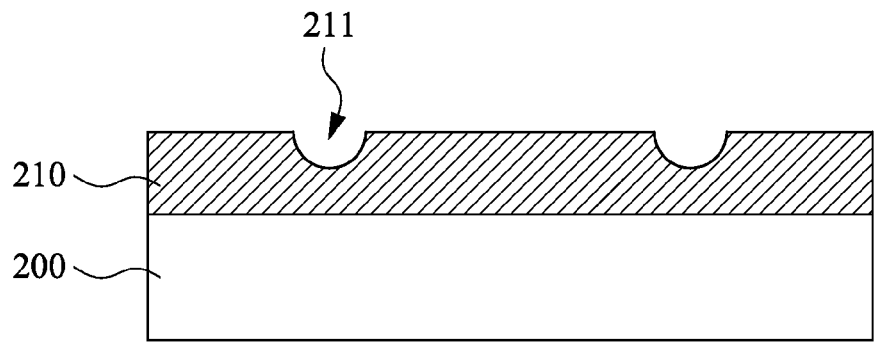

Referring to FIGS. 2A-2C, a carrier substrate 200 is received and identical to the carrier substrate 100 as previously described. The carrier substrate 200 includes a sacrificial layer 210. A first mask layer 230 is used in the photolithographic process to form a pattern 231. A plurality of rounded edge trenches 211 is formed on the sacrificial layer 210. The rounded edge trenches are achieved by anisotropic etching. Suitable etching processes include wet etching, hydrofluorine (HF) etching and/or anisotropic dry etching as shown in FIG. 2B. For example, a wet etching may be used to form a general contour of the trenches 211, and then an anisotropic dry etching is used to fine tune the curvature of the trenches 211. The trenches 211 have rounded edges, or more specifically, resembling a hemisphere. Sharp corners are made blunt to smooth curvature by the cycles of etching process, and selective etchability contributes to the fine tune result. A depth of the trenches 111 is shorter than the thickness of the sacrificial layer 110. That is, the trenches 111 do not go through the sacrificial layer 110 and will not expose underlying substrates. However, it should be understood that other geometrical configuration is also acceptable as long as the trenches 111 have a curved contour.

Figure 2D:
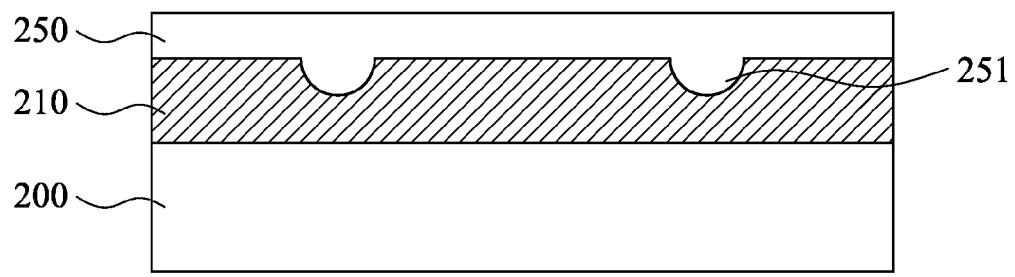

Referring to FIG. 2D, a first material 250 is deposited over the sacrificial layer 210. In the illustrated embodiment, the first material is a low stress nitride (LSN) layer. The first material 250 conformingly fills in the trenches 211 and at the same time exceeds the surface of the sacrificial layer 210 to any thickness. The first material 250 may be formed by any suitable process including vapor-phase epitaxy (VPE) using a feed gas such as silicon tetrachloride and a CVD process using a feed gas such as silane. Other suitable techniques include spin-on application, PVD, other CVD processes, HDP-CVD, and/or ALD. After the first material 250 is applied, a portion of the first material 250 defines the stoppers 251. The material of the first material 250 may be selected based on bonding properties as well as mechanical integrity. A chemical-mechanical polishing/planarization (CMP) process may also be used to provide a suitable surface for the subsequent bonding. It should be understood that a selective etchability exhibits between the first material 250 and the sacrificial layer 210.

Figure 2E:
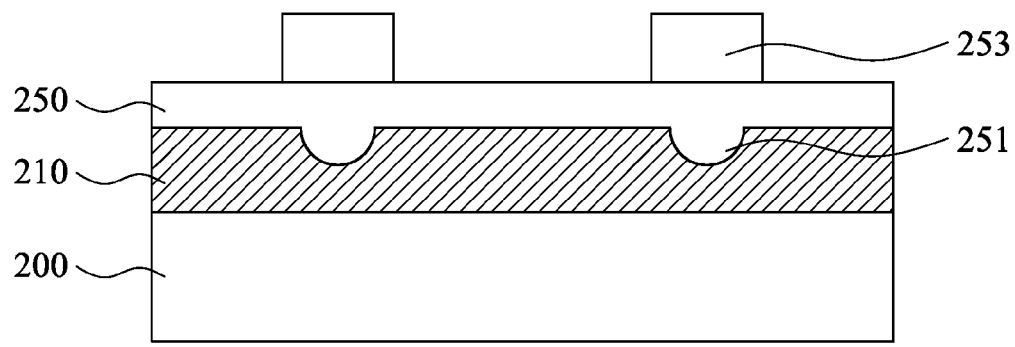

Referring to FIG. 2E, a patterned photoresist (PR) layer 253 is used as an etch mask to pattern the underlying first material 250. The photoresist layer 253 masks at least a portion of the first material 250 corresponding to the stoppers 251 as shown in FIG. 2E.

Figure 2F:
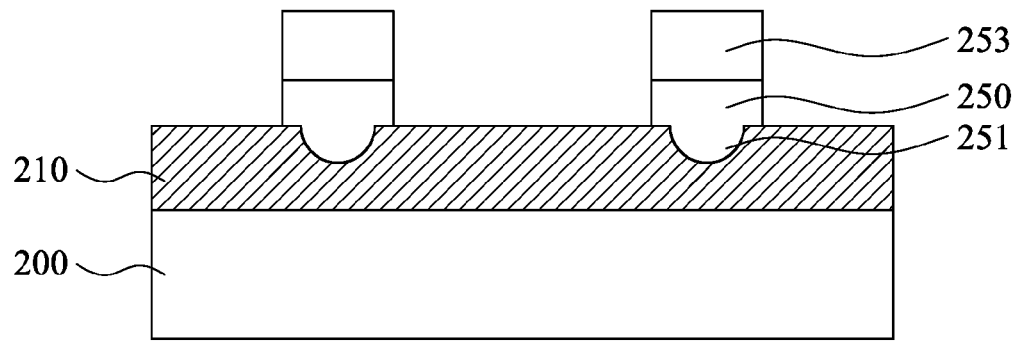
Figure 2G:
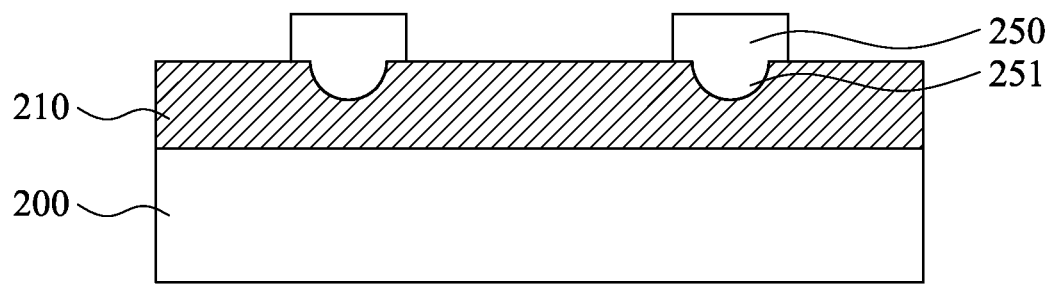

Referring to FIG. 2F, etching is performed on the first material 250. Suitable etching processes include dry etching, wet etching and/or other etching methods (e.g., reactive ion etching). In the illustrated embodiment, the etching process releases the unmask region of the first material 250. In addition to the stoppers 251, a portion of the overfilled first material 250 remains over the stoppers 251. The overfilled portion builds up a thickness higher than the surface of the sacrificial layer 210, and a width of the overfilled portion is slightly larger than a width of the stopper 251, and therefore the integrity of the stoppers 251 is secured in the etching process. The photoresist layer is then removed from the first material 250 as shown in FIG. 2G.

Figure 2H:
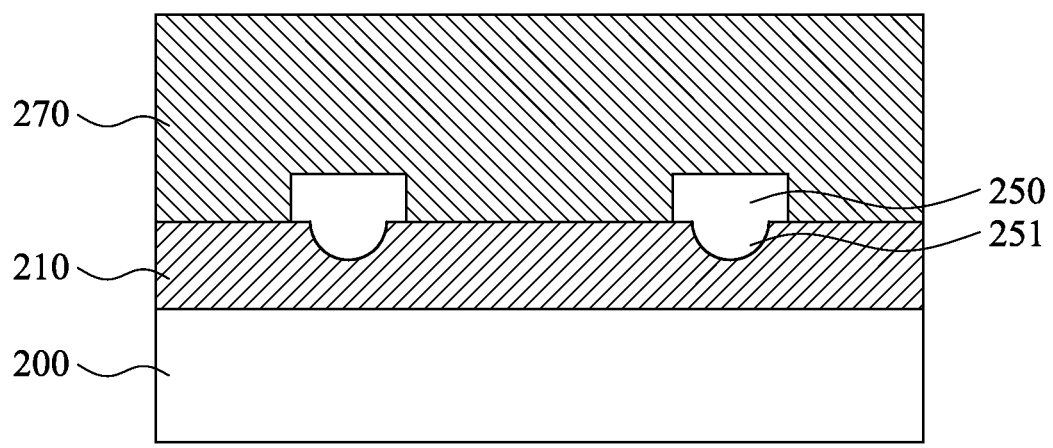

Referring to FIG. 2H, a second material 270 is deposited over the sacrificial layer 210. In the illustrated embodiment, the second material 270 is a polycrystalline silicon layer. The material of the second material 270 may be any suitable material exhibiting selective etchability between the first material 250 and the second material 270. The second material 270 may be formed by any suitable process including VPE, CVD, spin-on application, PVD, HDP-CVD, and/or ALD. The second material 270 is formed over the first material 250 to a thickness that at least envelop the entire first material 250 including the stoppers 251 and the overfilled portion of the first material 250.

Figure 2I:
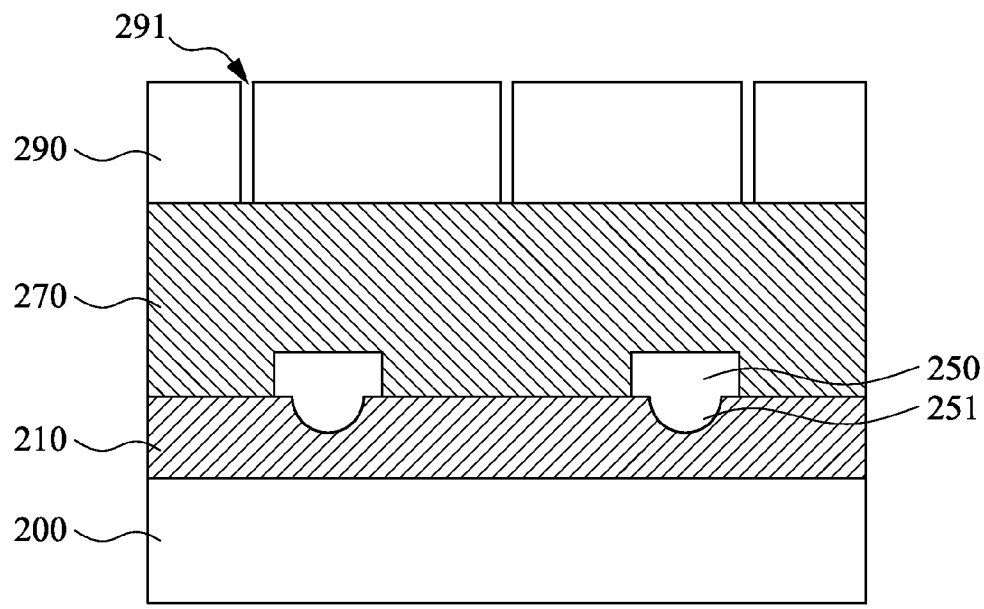
Figure 2J:
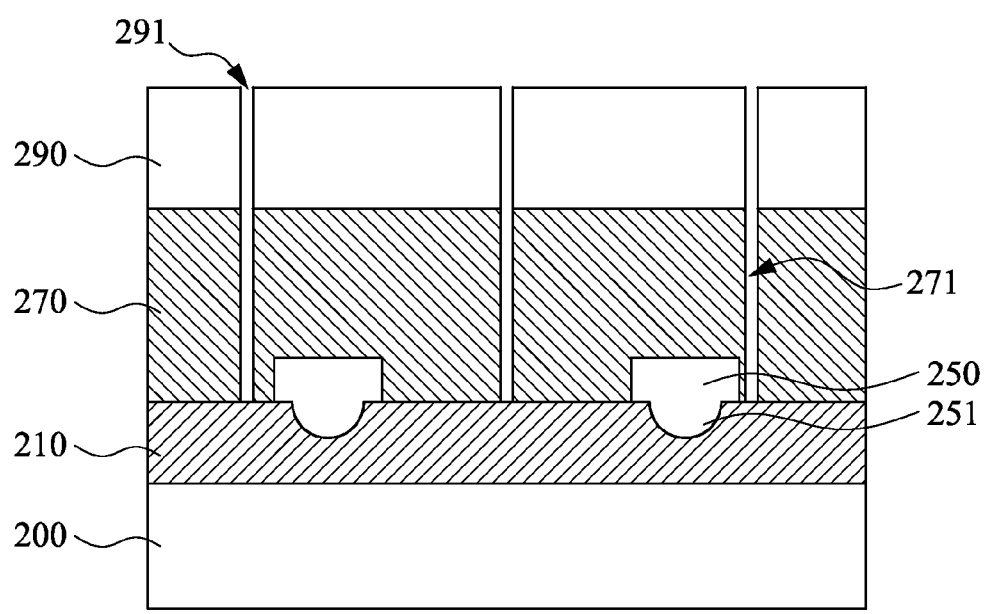

Referring to FIGS. 2I and 2J, a second mask layer 290 is deposited on the second material 270 and a plurality of vias 291 are formed by any suitable etching process. Etching process is advanced further to formed through vias 271 within the second material 270 to the sacrificial layer 210. The vias 271, 291 do not go through the overfilled portion of the first material 250 or stoppers 251. In the formation of the vias, the first material 250 remains its integrity.

Figure 2K:
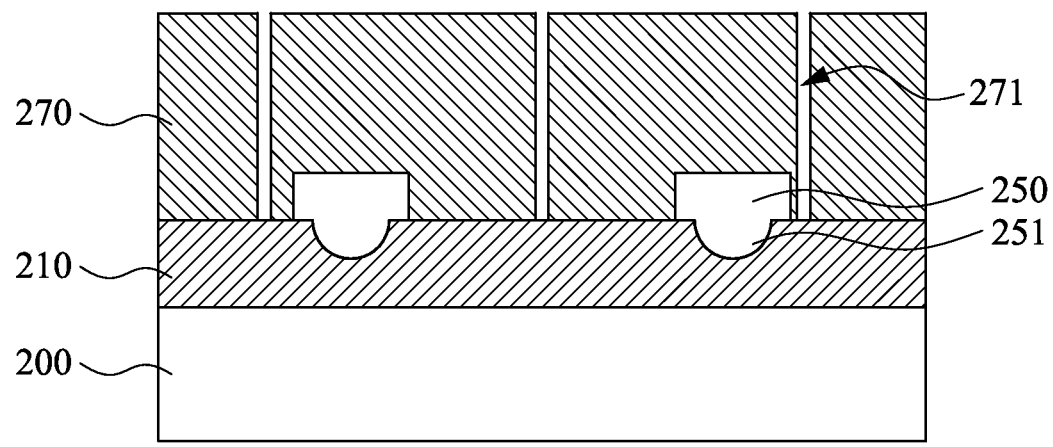
Figure 2L:
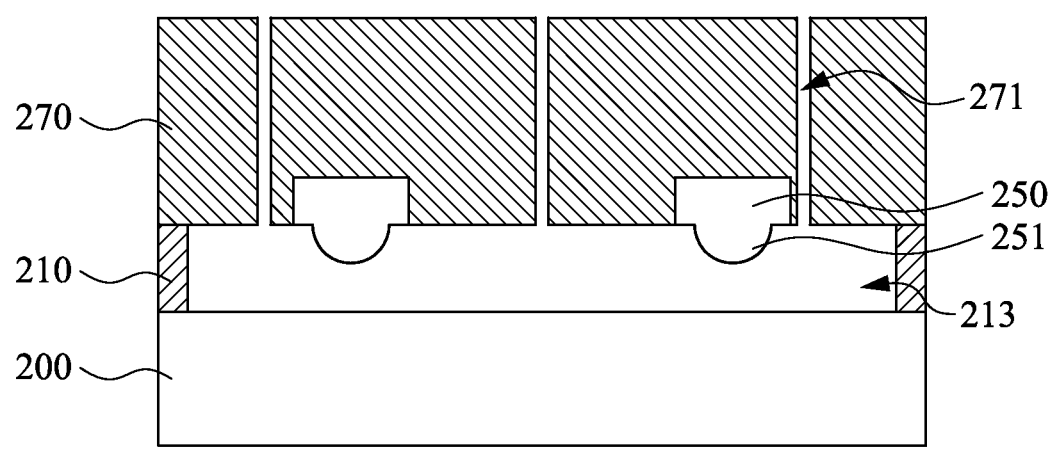

Referring to FIGS. 2K and 2L, the second mask layer 290 is removed and the sacrificial layer 210 is released by selective etching. After performing the selective etching, a recess 213 is formed. The recess 213 is collectively defined by the carrier substrate 200, the remaining sacrificial layer 210, first and second materials 250, 270. The rounded edge stoppers 251 are completely exposed upon the removal of the sacrificial layer 210. The stoppers 251 suspend over the recess 213 without making contact with the remaining sacrificial layer 210 and the carrier substrate 200.

Referring back to FIG. 1F, a MEMS device 10 includes a carrier substrate 100, a polycrystalline silicon layer 150 suspending over the carrier substrate 100 and a sacrificial layer 110. The polycrystalline silicon layer 150, the carrier substrate 100 and the sacrificial layer 110 collectively define a cavity 113. In the process of fabricating the MEMS device 10, the cavity 113 is created by etching the sacrificial layer 110. In other words, the cavity 113 is formed via identical methods and positioned the same as the recess 113 as previously described. The polycrystalline silicon layer 150 rests over a portion of a sacrificial layer 110 that encloses the cavity 113 from either side and connects the polycrystalline silicon layer 150 to the carrier substrate 100. At least a rounded edge stopper 151 is formed on the polycrystalline silicon layer 150. The stopper 151 protrudes from a surface of the polycrystalline silicon layer 150 toward the carrier substrate 100 without making contact therewith. In other words, the stopper 151 is hanging within the cavity 113. The stopper 151 has a smooth contour without sharp corners. For example, the stopper 151 may resemble a truncated cone with finely tuned rounded corner. The rounded edge provides higher capacity of shock absorption and leaves no residues behind when encountering a crash. More specifically, a width of the stopper 151 reduces from the polycrystalline silicon layer 150 toward the carrier layer 100. As shown in FIG. 2L a stopper 251 (i.e., the first material) is made of a different material from the overlying substrate (i.e., the second material 270), and a portion of the stopper 251 extends into the second material 270. However, the stopper 251 can be seen as an integrated portion of the second material 270 protruding from the substrate and serving as a shock absorber.

In some embodiments, the stopper 151 resembles a shape of hemisphere. The stopper 151 has a normal plane that is coplanar with a surface of the polycrystalline silicon layer 150. The hemispherical stopper 151 protrudes out of the polycrystalline silicon layer 150, reduces toward the carrier substrate 100 and finally closes in the middle of the cavity 113. The reduction of the stopper 151 is a smooth curvature, which is defined by the trenches 111, and can achieve substantially identical radius across its perimeter because the formation of trenches 111 involves cycles of anisotropic etching to fine tune the contour of the trenches 111. Upon releasing the sacrificial layer 110, the hemispherical stopper 151 is exposed and the hemispherical profile is maintained. When the stopper and the polycrystalline silicon layer are made of different materials, a portion of the stopper extends into the polycrystalline silicon layer to protect the hemispherical structure integrity when other processes are performed. The hemispherical bump points toward the carrier layer, and the remaining portion of the stopper have a width slightly larger than the diameter of the bump.

Thus, the instant disclosure provides a MEMS structure incorporating rounded edge stopper and a method of forming the structure. The rounded edge stopper protrudes from the polycrystalline silicon layer into the recess defined by the polycrystalline layer, the carrier substrate and the sacrificial layer. The polycrystalline silicon layer is connected to the carrier substrate via the remaining sacrificial layer and largely suspended over the carrier substrate. The stopper, like the polycrystalline silicon layer, hangs within the recess without making contact to the carrier substrate. The stopper serves as a shock absorber. Sharp corners are made blunt to the stopper such that when a crash takes place, smooth contour attenuates the force gently, and it is less likely to have residues left behind especially compared with conventional sharp-cornered bump. The rounded surface receives attack and releases the force evenly to the entire body because there is not a pointed tip to allow force accumulation in a small area. Therefore, the rounded edge stopper has higher capacity in shock absorbing, and it is unlikely to shed particles that hinder the motion of the movable member.

In some exemplary embodiment, a MEMS device includes a carrier substrate, a polycrystalline silicon layer, a sacrificial layer and a cavity defined by the polycrystalline silicon layer, the carrier substrate and the sacrificial layer. The polycrystalline silicon layer suspends over the carrier substrate and has at least one stopper with rounded edge and protrudes toward the carrier substrate and into the cavity.

In some exemplary embodiment, a MEMS device includes a carrier substrate, a polycrystalline silicon layer, a sacrificial layer and a cavity defined by the polycrystalline silicon layer, the carrier substrate and the sacrificial layer. The polycrystalline silicon layer suspends over the carrier substrate and has at least one stopper that protrudes from the polycrystalline silicon layer toward the carrier substrate and into the cavity and the stopper resembles a shape of hemisphere.

In some exemplary embodiment, a method of fabricating MEMS device includes forming a plurality of rounded edge trenches on a sacrificial layer over a carrier substrate. Then, formation of a polycrystalline silicon layer over the sacrificial layer to fill the trenches. A plurality of stoppers is defined by the trenches and protrudes from the polycrystalline silicon layer toward the carrier substrate Subsequently, a portion of the sacrificial layer is removed to define a recess between the polycrystalline silicon layer and a carrier substrate and expose the stoppers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a MEMS device, comprising:
   forming a plurality of rounded edge trenches on a sacrificial layer over a carrier substrate;
   forming a polycrystalline silicon layer over the sacrificial layer to fill the trenches, wherein a plurality of stoppers are defined by the trenches and protrude from the polycrystalline silicon layer toward the carrier substrate;
   etching the polycrystalline silicon layer through to the sacrificial layer to form a plurality of vias; and
   removing a portion of the sacrificial layer by selective etching through the vias to define a recess between the polycrystalline silicon layer and a carrier substrate and to expose the stoppers.

2. The method of fabricating the MEMS device of claim 1, wherein the stoppers are spatially apart from the vias.

3. The method of fabricating the MEMS device of claim 1, wherein the trenches are formed by anisotropic etching.

4. The method of fabricating the MEMS device of claim 3, wherein a width of the trenches reduces from the sacrificial layer toward the carrier substrate.

5. The method of fabricating the MEMS device of claim 3, wherein the trenches define a shape of hemisphere having a normal plane coplanar to the sacrificial layer.

6. The method of fabricating the MEMS device of claim 5, wherein the trenches have a radius shorter than a thickness of the sacrificial layer.

7. The method of fabricating the MEMS device of claim 1, wherein the sacrificial layer is a dielectric layer including an oxide material.

8. The method of fabricating the MEMS device of claim 1, wherein forming the plurality of rounded edge trenches on the sacrificial layer over a carrier substrate further comprises:
   forming a mask layer on the sacrificial layer;
   patterning the mask layer to define positions of the rounded edge trenches; and
   etching the sacrificial layer according to the patterning.

9. The method of fabricating the MEMS device of claim 8, wherein etching the sacrificial layer comprises cycles of different types of etching.

10. The method of fabricating the MEMS device of claim 8, wherein etching the sacrificial layer comprises cycles that comprise:
  wet etching the sacrificial layer; and
  anisotropic dry etching the sacrificial layer.

11. The method of fabricating the MEMS device of claim 1, wherein the polycrystalline silicon layer is suspended on the carrier substrate.

12. The method of fabricating the MEMS device of claim 1, wherein the polycrystalline silicon layer is discrete in the presence of the vias.

13. The method of fabricating the MEMS device of claim 1, wherein the sacrificial layer interposes in between the polycrystalline silicon layer and the carrier substrate.

14. The method of fabricating the MEMS device of claim 1, wherein the stoppers are suspend over the carrier substrate.

15. The method of fabricating the MEMS device of claim 1, wherein a gap is formed between the stoppers and the carrier substrate.

16. The method of fabricating the MEMS device of claim 1, wherein the recess is enclosed by the carrier substrate, the remaining sacrificial layer, and the polycrystalline silicon layer.

17. The method of fabricating the MEMS device of claim 1, wherein the polycrystalline silicon layer has varied depth.

18. The method of fabricating the MEMS device of claim 1, wherein the carrier substrate includes an elementary semiconductor.

* * * * *